US010094663B2

(12) United States Patent
Kesäniemi

(10) Patent No.: US 10,094,663 B2
(45) Date of Patent: Oct. 9, 2018

(54) MAGNETOMETER APPARATUS AND ASSOCIATED METHODS

(71) Applicant: Nokia Technologies Oy, Espoo (FI)

(72) Inventor: Martti Kesäniemi, Espoo (FI)

(73) Assignee: Nokia Technologies Oy, Espoo (FI)

( * ) Notice: Subject to any disclaimer, the term of this patent is extended or adjusted under 35 U.S.C. 154(b) by 199 days.

(21) Appl. No.: 15/129,703

(22) PCT Filed: Mar. 27, 2015

(86) PCT No.: PCT/FI2015/050215
§ 371 (c)(1),
(2) Date: Sep. 27, 2016

(87) PCT Pub. No.: WO2015/150627
PCT Pub. Date: Oct. 8, 2015

(65) Prior Publication Data
US 2017/0160086 A1 Jun. 8, 2017

(30) Foreign Application Priority Data
Apr. 3, 2014 (GB) .................................. 1406018.0

(51) Int. Cl.
*G01C 17/38* (2006.01)
*G01C 17/02* (2006.01)
*G01R 33/00* (2006.01)

(52) U.S. Cl.
CPC ............ *G01C 17/38* (2013.01); *G01C 17/02* (2013.01); *G01R 33/0035* (2013.01)

(58) Field of Classification Search
CPC ..................................................... G01C 17/38
(Continued)

(56) References Cited

U.S. PATENT DOCUMENTS 5,187,872 A 2/1993 DuFour
7,210,236 B2 5/2007 Sato et al.
(Continued)

FOREIGN PATENT DOCUMENTS

EP D634001 1/1995
EP 2503285 9/2012
(Continued)

OTHER PUBLICATIONS

Ozyagcilar, "Calibrating an Ecompass in the Presence of Hard and Soft-iron Interference", Freescale Semiconductor, Document No. AN4246, Revision 3, Apr. 2013, pp. 1-17.
(Continued)

*Primary Examiner* — G. Bradley Bennett
(74) *Attorney, Agent, or Firm* — Nokia Technologies Oy

(57) ABSTRACT

An apparatus comprising: a processor; and a memory including computer program code, the memory and the computer program code configured to, with the processor, cause the apparatus to perform at least the following: determine whether or not recalibration is required of a magnetometer configured to compensate for hard-iron and soft-iron effects by determining whether a plurality of magnetometer readings received from the magnetometer is consistent with: a scaled pre-calibrated matrix describing the soft-iron effect for at least one scaling factor of the pre-calibrated matrix; and a pre-calibrated vector describing the hard-iron effect.

15 Claims, 5 Drawing Sheets

(58) Field of Classification Search
USPC .................................................. 33/356, 357
See application file for complete search history.

(56) References Cited

U.S. PATENT DOCUMENTS

| | | | |
|---|---|---|---|
| 7,275,008 | B2 | 9/2007 | Plyvanainen |
| 8,374,816 | B2 | 2/2013 | Vu |
| 8,494,799 | B2 | 7/2013 | Piemonte et al. |
| 2006/0066295 | A1 | 3/2006 | Tamura et al. |
| 2009/0171607 | A1 | 7/2009 | Chen et al. |
| 2009/0254294 | A1 | 10/2009 | Dutta |
| 2010/0312513 | A1 | 12/2010 | Mayor et al. |
| 2013/0006573 | A1 | 1/2013 | Brunner et al. |
| 2013/0060470 | A1 | 3/2013 | Handa |
| 2013/0124129 | A1 | 5/2013 | Waters |
| 2013/0185018 | A1 | 7/2013 | Sheng |
| 2014/0254817 | A1* | 9/2014 | Vilermo ............... H04R 1/32 381/74 |
| 2014/0297212 | A1* | 10/2014 | Anderson ........... G01C 25/005 702/90 |
| 2016/0069681 | A1* | 3/2016 | Johnson ............. G01C 17/38 33/303 |
| 2017/0343349 | A1* | 11/2017 | Han .................... G01C 17/38 |
| 2018/0058857 | A1* | 3/2018 | Yost .................... G01C 21/165 |
| 2018/0120109 | A1* | 5/2018 | Fite-Georgel ......... G01C 17/38 |

FOREIGN PATENT DOCUMENTS

| | | |
|---|---|---|
| EP | 2623995 | 8/2013 |
| EP | 2669625 A1 | 12/2013 |
| GB | 2479456 | 10/2011 |
| WO | 2014022664 | 2/2014 |

OTHER PUBLICATIONS

Olivares et al., "Automatic Determination of Validity of Input Data Used in Ellipsoid Fitting Marg Calibration Algorithms", Sensors, vol. 13, 2013, pp. 11797-11817.

Office Action received for corresponding United Kingdom Patent Application No. 1406018.0, dated Jul. 21, 2017, 3 pages.

Office Action received for corresponding United Kingdom Patent Application No. 1406018.0, dated Apr. 19, 2018, 4 pages.

International Search Report and Written Opinion received for corresponding Patent Cooperation Treaty Application No. PCT/FI2015/050215 , dated Jul. 27, 2015, 18 pages.

Search Report received for corresponding GB Application No. 1406018.0 , dated Oct. 6, 2014, 5 pages.

* cited by examiner

MAGNETOMETER APPARATUS AND ASSOCIATED METHODS

RELATED APPLICATION

This application was originally filed as PCT Application No. PCT/FI2015/050215 filed Mar. 27, 2015 which claims priority benefit from GB Patent Application No. 1406018.0 filed Apr. 3, 2014.

TECHNICAL FIELD

The present disclosure relates to the field of magnetometers, associated methods, computer programs and apparatus. Certain disclosed aspects/examples relate to portable electronic devices, in particular, so-called hand-portable electronic devices which may be hand-held in use (although they may be placed in a cradle in use). Such hand-portable electronic devices include mobile telephones, so-called Personal Digital Assistants (PDAs), smartphones and other smart devices, and tablet PCs.

The portable electronic devices/apparatus according to one or more disclosed aspects/embodiments may provide one or more audio/text/video communication functions (e.g. tele-communication, video-communication, and/or text transmission (Short Message Service (SMS)/Multimedia Message Service (MMS)/e-mailing) functions), interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture functions (e.g. using a (e.g. in-built) digital camera), and gaming functions.

BACKGROUND

A portable device such as a cellular phone or a smart phone can now be equipped with an electronic compass. The electronic compass calculates an orientation of the compass relative to the Earth's magnetic field. This information may be provided to the user (e.g. as an arrow pointing true north, or as a read-out giving the orientation of the device) or provided to an application (e.g. a navigation application).

The listing or discussion of a prior-published document or any background in this specification should not necessarily be taken as an acknowledgement that the document or background is part of the state of the art or is common general knowledge. One or more aspects/examples of the present disclosure may or may not address one or more of the background issues.

SUMMARY

In a first example aspect there is provided an apparatus comprising:
  a processor; and
  a memory including computer program code,
  the memory and the computer program code configured to, with the processor, cause the apparatus to perform at least the following:
  determine whether or not recalibration is required of a magnetometer configured to compensate for hard-iron and soft-iron effects by determining whether a plurality of magnetometer readings received from the magnetometer is consistent with:

a scaled pre-calibrated matrix describing the soft-iron effect for at least one scaling factor of the pre-calibrated matrix; and
a pre-calibrated vector describing the hard-iron effect.

Hard-iron effects may be produced by materials that exhibit a constant, additive field to the earth's magnetic field, thereby generating a constant additive value to the output of each of the magnetometer axes. A speaker magnet, for example, may produce a hard-iron distortion. As long as the orientation and position of the magnet relative to the sensor is constant the field and associated offsets will also be constant. Hard-iron effects distort the magnetic field strength vector by shifting the centre of the sphere (or ellipsoid) of magnetic field strength vectors $\vec{B}$ away from the origin.

Soft-iron effects may occur in the presence of materials that influences, or distorts, a magnetic field—but does not necessarily generate a magnetic field itself. For example, iron and nickel may generate a soft-iron distortion. While hard-iron distortion is constant regardless of orientation, the distortion produced by soft-iron materials is dependent upon the orientation of the material relative to the sensor and the magnetic field. Hard-iron effects distort the magnetic field strength vector by distorting magnetic field strength vectors $\vec{B}$ to form an ellipsoid.

The hard-iron and soft-iron effects may be produced by a magnetometer housing which is rigidly attached to the magnetometer. For example, if the magnetometer was in a car, the housing may be the car; if the magnetometer was part of a mobile phone, the housing may be the mobile phone, or a housing for the magnetometer itself which is not the housing for the phone. The apparatus may comprise the magnetometer. The apparatus may comprise a housing attached to the magnetometer.

It will be appreciated that, in the absence of hard-iron and soft-iron effects, all measurements of magnetic field strength vectors B lie on the surface of a sphere (when plotted on a graph where the axes define) which is centred on the origin. That is, for each measurement:

$$|\vec{B}| = \left\| \begin{pmatrix} B_1 \\ B_2 \\ B_3 \end{pmatrix} \right\| = \sqrt{B_1^2 + B_2^2 + B_3^2} = r$$

where r is a constant and corresponds to the radius of the sphere. In other words, the magnetometer will measure the same magnetic field strength $\vec{B}$ regardless of the magnetometer's orientation with respect to the magnetic field, and $B_1$, $B_2$, and $B_3$ are the components of the magnetic field strength vector $\vec{B}$ in a coordinate system defined by the orientation of the device. The measured orientation will change as the magnetometer's orientation with respect to the magnetic field changes.

Recalibration of the magnetometer may comprise at least one of:
  adjusting the values of the pre-calibrated vector describing the hard-iron effect; and
  adjusting the relative values of the matrix describing the soft-iron effect.

The plurality of magnetometer readings may correspond to different orientations of the magnetometer taken at substantially the same position. That is, the plurality of magnetometer readings ideally should be taken so that the true magnetic field strength and/or direction is not different for different readings of the plurality of magnetometer readings. As the true magnetic field strength and/or direction may change with position, the plurality of magnetometer readings may be taken without substantially moving (e.g. translating) the magnetometer.

The pre-calibrated matrix and/or pre-calibrated vector values may correspond to values determined at the time of manufacture (e.g. in the factory). The pre-calibrated matrix and/or pre-calibrated vector values may correspond to values determined when a previous calibration was performed for the magnetometer/device (e.g. the last time the magnetometer/device was calibrated). For example, the pre-calibrated matrix values may correspond to values determined at the time of manufacture, and the pre-calibrated vector values may correspond to values determined the last time the magnetometer/device was calibrated (e.g. after the time of manufacture).

The pre-calibrated matrix and pre-calibrated vector values may be the values currently being used to compensate for hard-iron and soft-iron effects.

The pre-calibrated matrix may be independent of the magnetic field strength corresponding to the calibration.

The pre-calibrated matrix may comprise information relating to the magnetic field strength corresponding to the calibration.

The apparatus may be configured to calibrate the magnetometer.

The apparatus may receive data corresponding to the orientation of the magnetometer (or a device comprising the magnetometer and possibly a housing). The orientation of the device may be determined using one or more of, for example, an accelerometer, a gyroscope, and an Inertial Measurement Unit (IMU). The apparatus may be configured to determine the orientation of the device.

The apparatus may be configured to perform the determination in response to one or more of the following conditions being satisfied:
  the number of received magnetometer readings exceeds a readings number threshold;
  the range of orientations corresponding to the received magnetometer readings exceeds an orientation range threshold; and
  the number of different orientations corresponding to the received magnetometer readings exceeds an orientation number threshold.

The plurality of magnetometer readings may comprise over 10 magnetometer readings. The plurality of magnetometer readings may comprise more than 100 magnetometer readings.

The apparatus may be configured to determine that recalibration is not required if the received magnetometer readings are consistent, within a consistency threshold, with the scaled pre-calibrated matrix describing the soft-iron effect for at least one scaling factor of the pre-calibrated matrix; and the pre-calibrated vector describing the hard-iron effect.

The apparatus may be configured to store multiple sets of pre-calibration data, each set of pre-calibration data comprising a scaled pre-calibrated matrix describing the soft-iron effect; and a pre-calibrated vector describing the hard-iron effect.

The apparatus may be configured to determine whether or not recalibration is required of a magnetometer by determining whether a plurality of magnetometer readings received from the magnetometer is consistent with at least one of multiple sets of pre-calibration data, each set of pre-calibration data comprising a scaled pre-calibrated matrix describing the soft-iron effect; and a pre-calibrated vector describing the hard-iron effect comprising a scaled pre-calibrated matrix describing the soft-iron effect; and a pre-calibrated vector describing the hard-iron effect.

The apparatus may be configured to recalibrate the magnetometer based on the plurality of received magnetometer readings if the plurality of received magnetometer readings is not consistent with:
  a scaled pre-calibrated matrix describing the soft-iron effect for at least one scaling factor of the pre-calibrated matrix; and
  a pre-calibrated vector describing the hard-iron effect.

The magnetometer may comprise at least one of: a Hall effect sensor; a giant magneto-resistance (GMR) sensor; magnetic tunnelling junction (MTJ); and an anisotropic magneto-resistive (AMR) sensor.

According to a further aspect, there is provided a method, the method comprising:
  determining whether or not recalibration is required of a magnetometer configured to compensate for hard-iron and soft-iron effects by determining whether a plurality of magnetometer readings received from the magnetometer is consistent with:
    a scaled pre-calibrated matrix describing the soft-iron effect for at least one scaling factor of the pre-calibrated matrix; and
    a pre-calibrated vector describing the hard-iron effect.

According to a further aspect, there is provided a computer program, the computer program configured to:
  enable determination of whether or not recalibration is required of a magnetometer configured to compensate for hard-iron and soft-iron effects by determining whether a plurality of magnetometer readings received from the magnetometer is consistent with:
    a scaled pre-calibrated matrix describing the soft-iron effect for at least one scaling factor of the pre-calibrated matrix; and
    a pre-calibrated vector describing the hard-iron effect.

The method may comprise calibrating the magnetometer.

The method may comprise enabling the determination in response to one or more of the following conditions being satisfied:
  the number of received magnetometer readings exceeds a readings number threshold;
  the range of orientations corresponding to the received magnetometer readings exceeds an orientation range threshold; and
  the number of different orientations corresponding to the received magnetometer readings exceeds an orientation number threshold.

The method may comprise determining that recalibration is not required if the received magnetometer readings are consistent, within a consistency threshold, with the scaled pre-calibrated matrix describing the soft-iron effect for at least one scaling factor of the pre-calibrated matrix; and the pre-calibrated vector describing the hard-iron effect.

The method may comprise storing multiple sets of pre-calibration data, each set of pre-calibration data comprising a scaled pre-calibrated matrix describing the soft-iron effect; and a pre-calibrated vector describing the hard-iron effect The method may comprise determining whether or not recalibration is required of a magnetometer by determining whether a plurality of magnetometer readings received from the magnetometer is consistent with at least one of multiple sets of pre-calibration data, each set of pre-calibration data comprising a scaled pre-calibrated matrix describing the soft-iron effect; and a pre-calibrated vector describing the hard-iron effect comprising a scaled pre-calibrated matrix describing the soft-iron effect; and a pre-calibrated vector describing the hard-iron effect.

The method may comprise recalibrating the magnetometer based on the plurality of received magnetometer readings if the plurality of received magnetometer readings is not consistent with:
- a scaled pre-calibrated matrix describing the soft-iron effect for at least one scaling factor of the pre-calibrated matrix; and
- a pre-calibrated vector describing the hard-iron effect.

Corresponding computer programs for implementing one or more of the methods disclosed are also within the present disclosure and encompassed by one or more of the described examples.

In a further aspect there is provided an apparatus, the apparatus comprising:
means for enabling configured to enable determination of whether or not recalibration is required of a magnetometer configured to compensate for hard-iron and soft-iron effects by determining whether a plurality of magnetometer readings received from the magnetometer is consistent with:
- a scaled pre-calibrated matrix describing the soft-iron effect for at least one scaling factor of the pre-calibrated matrix; and
- a pre-calibrated vector describing the hard-iron effect.

The present disclosure includes one or more corresponding aspects, examples or features in isolation or in various combinations whether or not specifically stated (including claimed) in that combination or in isolation. Corresponding means and corresponding functional units (e.g., enabler) for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which.

DESCRIPTION OF EXAMPLE ASPECTS

A magnetometer can be used to help determine or define the orientation of the device or housing to which it is attached (e.g. mobile phone, aircraft, car, boat) with respect to the magnetic field created by the earth. The determined orientation may be presented to the user or may be used by applications e.g. navigation applications, or in applications which present location data to the user depending on the orientation of the device (e.g. star charts, or augmented reality (AR) software that gives dynamic information, through a phone's camera display or other device, about users' surroundings such as shops, restaurants, and points of interest).

In addition to the geographic location and orientation, magnetic properties of materials in the device or housing to which the magnetometer is attached, may affect the values measured by a magnetometer. The effects of materials in the device or housing to which the magnetometer is attached may be described as hard-iron and/or soft-iron effects. In order to more correctly determine or define the orientation of the device, the effect of these hard-iron and/or soft-iron effects may be modelled and compensated for in order to find a more accurate orientation of the magnetic field outside the device. The process of this modelling is called magnetometer calibration.

Of course, other objects external to the device may also affect how the earth's magnetic field is experienced by the magnetometer, including large metallic objects, such as cars and buildings. In the presence of such objects, even a calibrated magnetometer may display the device orientation incorrectly, even though it would measure the field direction correctly. Such changes in surrounding conditions may make it difficult to correctly recognize the need for recalibration, as will be explained below.

In the absence of hard-iron and soft-iron effects, all measurements of magnetic field strength vectors $\vec{B}$ lie on the surface of a sphere which is centered on the origin. That is, for each measurement:

$$|\vec{B}| = \left\| \begin{pmatrix} B_1 \\ B_2 \\ B_3 \end{pmatrix} \right\| = \sqrt{B_1^2 + B_2^2 + B_3^2} = r$$

where r is a constant and corresponds to the radius of the sphere. $B_1$, $B_2$, and $B_3$ are the components of the magnetic field strength vector $\vec{B}$ in a coordinate system defined by the orientation of the device.

Figure 1:
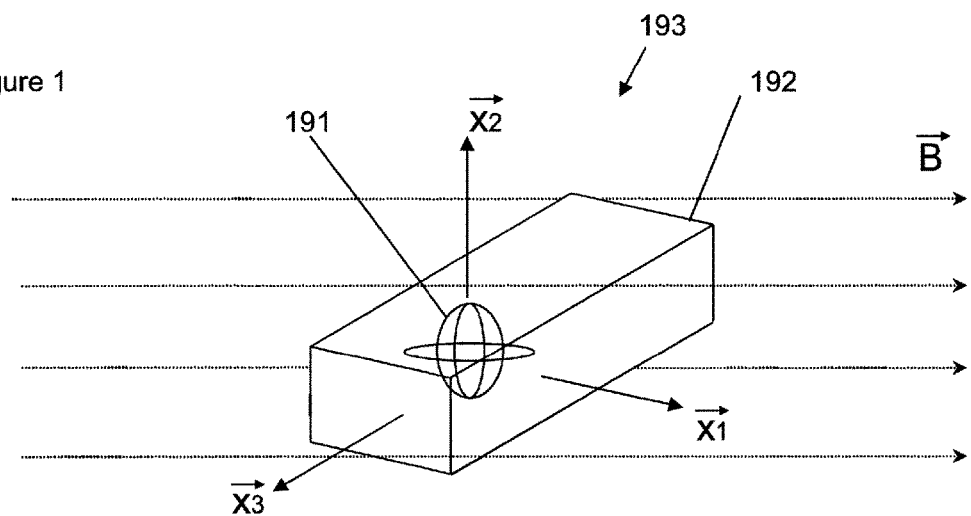
FIG. 1 illustrates an example device comprising a magnetometer and a housing, the device being in a magnetic field.

FIG. 1 which shows a device 193 comprising a magnetometer 191 and a housing 192 and a coordinate system $\vec{x}_1$, $\vec{x}_2$, $\vec{x}_3$ defined with respect to the device. With reference to FIG. 1, $B_1$ is the component of magnetic field strength vector $\vec{B}$ in the direction $B_2$ is the component of magnetic field strength vector $\vec{B}$ in the direction $\vec{x}_2$, and $B_3$ is the component of magnetic field strength vector $\vec{B}$ in the direction $\vec{x}_3$. In this case, $\vec{x}_1$; $\vec{x}_2$; and $\vec{x}_3$ are a right-handed orthogonal coordinate system defined with respect to a device comprising a magnetometer 191 and a housing 192, the housing 192 being rigidly connected to the magnetometer 191 such that the magnetometer is configured to rotate in concert with the housing 192. It will be appreciated that other example embodiments may use other coordinate systems.

Hard-iron effects may be produced by materials that exhibit a constant, additive field to the earth's magnetic field, thereby generating a constant additive value to the output of the magnetometer. A speaker magnet, for example, may produce a hard-iron distortion. As long as the orientation and position of the magnet relative to the magnetometer is constant the field and associated offsets will also be constant. Hard-iron effects distort the magnetic field strength vector by shifting the centre of the sphere (or ellipsoid) of measured magnetic field strength vectors $\vec{B}$ away from the origin.

Soft-iron effects may occur in the presence of materials that influences, or distorts, a magnetic field—but does not necessarily generate a magnetic field itself. For example, iron and nickel (or other non-magnetised ferromagnetic materials) may generate a soft-iron distortion. While hard-iron distortion is constant regardless of orientation, the distortion produced by soft-iron materials is dependent upon the orientation of the material relative to the magnetometer and to the magnetic field (e.g. the earth's magnetic field being measured). Soft-iron effects distort the magnetic field strength vector by distorting magnetic field strength vectors $\vec{B}$ to form an ellipsoid.

It is important to note that the hard-iron and soft-iron effects arise from the distorting material(s) rotating/moving with the magnetometer. An example would be mounting the magnetometer in a car; any materials that are part of the car (iron-based bodywork, or speaker magnets) may exhibit a hard-iron or soft-iron distorting effect as they would move as the car and mounted magnetometer move.

The hard-iron and soft-iron effects of the materials affecting the magnetometer can be modelled with using the following equation:

$$\vec{B'} = M\vec{B} + \vec{c} \qquad \text{(Equation 1)}$$

where $\vec{B}$ is a vector denoting the true magnetic field, M is a matrix describing the soft-iron effect, $\vec{B}$ is a vector describing the measured magnetic field, and $\vec{c}$ is a vector modelling the origin shift caused by the hard-iron effect. For the three-dimensional case, equation 1 written in full is:

$$\begin{pmatrix} B'_1 \\ B'_2 \\ B'_3 \end{pmatrix} = \begin{pmatrix} M_{11} & M_{12} & M_{13} \\ M_{21} & M_{22} & M_{23} \\ M_{31} & M_{32} & M_{33} \end{pmatrix} \begin{pmatrix} B_1 \\ B_2 \\ B_3 \end{pmatrix} + \begin{pmatrix} c_1 \\ c_2 \\ c_3 \end{pmatrix}$$

A calibration procedure solves the values of matrix M and vector $\vec{c}$; that is, a total of 12 unknown real numbers are to be solved for the three dimensional case. It will be appreciated that in some cases, only the magnetic field in two dimensions is required (e.g. in the horizontal plane), in which case, equation 1 can be written as:

$$\begin{pmatrix} B'_1 \\ B'_2 \end{pmatrix} = \begin{pmatrix} M_{11} & M_{12} \\ M_{21} & M_{22} \end{pmatrix} \begin{pmatrix} B_1 \\ B_2 \end{pmatrix} + \begin{pmatrix} c_1 \\ c_2 \end{pmatrix}$$

After solving the unknowns, the real magnetic field value can be solved form the equation:

$$\vec{B} = M^{-1}(\vec{B'} - \vec{c}) \qquad \text{(Equation 2)}$$

In practice, matrix M and offset $\vec{c}$ are solved by relying to the constant strength of the magnetic field outside the device: when that assumption is valid, rotating the device (which in the magnetometer's point of view is the same as rotating the field direction outside the device) draws an ellipse/ellipsoid (ellipse for 2D case; ellipsoid for 3D case) in the measurement space of the magnetometer. Values in matrix M can be solved from the shape of this ellipse/ellipsoid, and the offset $\vec{c}$ corresponds to the vector connecting the origin to the centre-point of the ellipse/ellipsoid.

In practice, however, field strength outside the device in not constant, but it changes as metallic objects near the device bend the field direction, causing the field to be more dense in one location than the other. This may cause calibration problems, for example inside buildings, and also outside when the device is moved around in cities where there are lots of buildings, cars and other objects with materials that interact with the earth magnetic field.

Such changes in the field strength may cause unnecessary events requiring recalibration. That is, when the measured magnetometer magnetic field strength vectors $\vec{B'}$ are located on the surface of the ellipse/ellipsoid, properly calibrated magnetic field strength vectors $\vec{B}$ of equation 2 would be located on the surface of a circle/sphere (circle in 2D case; sphere in 3D case). However, when the strength of the field outside the device changes, the calibrated magnetic field strength vectors $\vec{B}$ will no longer be located on the surface of the same ellipse/ellipsoid, so using a criterion of whether the calibrated values lies on a previously determined ellipse/ellipsoid may launch a recalibration event when the external field changes (e.g. the field direction or magnitude changes).

However, as stated above, calibration may only be required to compensate the error caused by the magnetic properties of the magnetometer housing. However, those properties are not affected by the change of the field strength outside the device (e.g. phone, car, boat), so such a recalibration event may be unnecessary.

The present disclosure relates to an apparatus comprising:
a processor; and
a memory including computer program code,
the memory and the computer program code configured to, with the processor, cause the apparatus to perform at least the following:
determine whether or not recalibration is required of a magnetometer configured to compensate for hard-iron and soft-iron effects by determining whether a plurality of magnetometer readings received from the magnetometer is consistent with:
a scaled pre-calibrated matrix describing the soft-iron effect for at least one scaling factor of the pre-calibrated matrix; and
a pre-calibrated vector describing the hard-iron effect.

Figure 2:
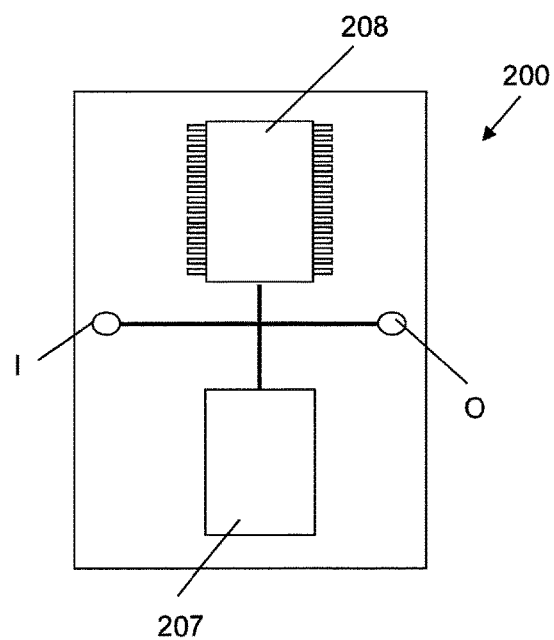
FIG. 2 illustrates an example device embodiment comprising a number of electronic components, including memory and a processor, according to one embodiment of the present disclosure.
Figure 3:
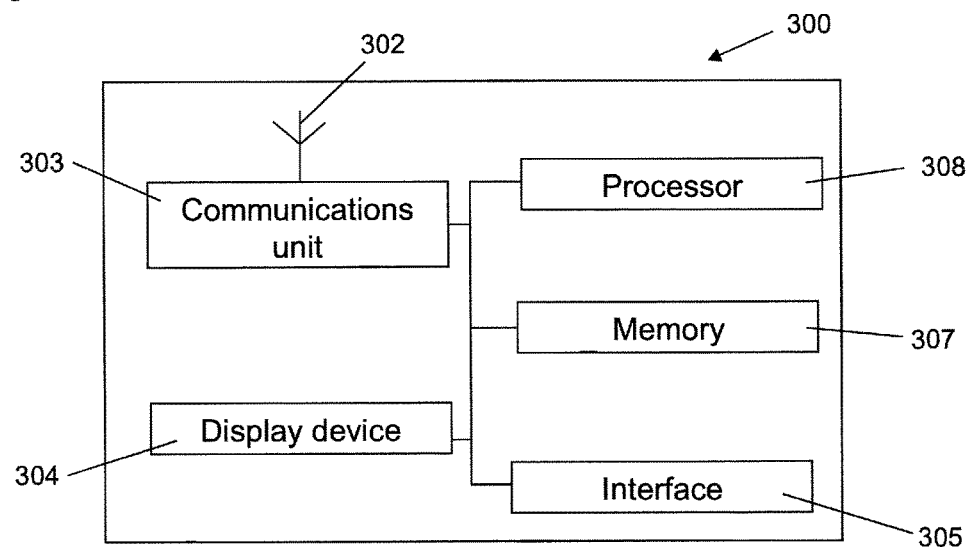
FIG. 3 illustrates an example apparatus embodiment comprising a number of electronic components, including memory, a processor and a communication unit, according to another embodiment of the present disclosure.
Figure 4:
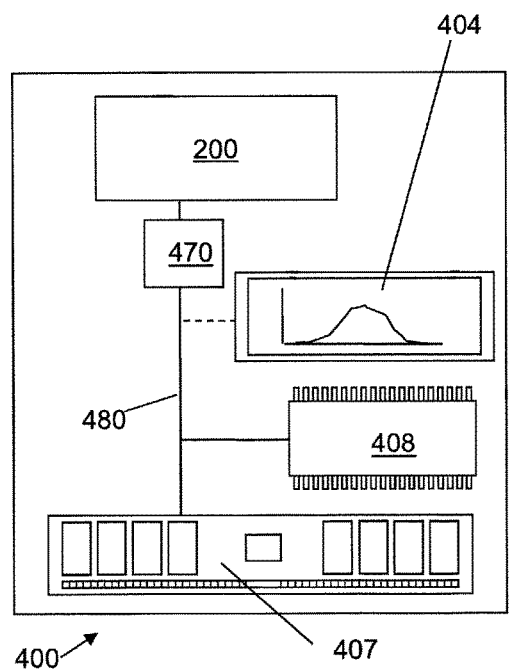
FIG. 4 illustrates an example apparatus embodiment comprising a number of electronic components, including memory and a processor, according to another embodiment of the present disclosure.

FIGS. 2-4 show various embodiments of an apparatus according to the present disclosure used in the context of the calibration and recalibration of a magnetometer.

FIG. 2 shows an apparatus 200 comprising memory 207, a processor 208, input I and output O. In this embodiment only one processor and one memory are shown but it will be appreciated that other embodiments may utilise more than one processor and/or more than one memory (e.g. same or different processor/memory types).

In this embodiment the apparatus 200 is an Application Specific Integrated Circuit (ASIC) for a portable electronic device with a touch sensitive display. In other embodiments the apparatus 200 can be a module for such a device, or may be the device itself, wherein the processor 208 is a general purpose CPU of the device and the memory 207 is general purpose memory comprised by the device.

The input I allows for receipt of signalling to the apparatus 200 from further components (not shown), such as a magnetometer or components of a portable electronic device (like a touch-sensitive or hover-sensitive display) or the like. The output O allows for onward provision of signalling from within the apparatus 200 to further components such as a display screen, speaker, or vibration module. In this embodiment the input I and output O are part of a connection bus that allows for connection of the apparatus 200 to further components.

The processor 208 is a general purpose processor dedicated to executing/processing information received via the input I in accordance with instructions stored in the form of computer program code on the memory 207. That is, the processor may be used to perform the determination of whether recalibration of a magnetometer is required based on magnetometer readings received from the input I. The output signalling generated by such operations from the processor 208 is provided onwards to further components via the output O.

The memory 207 (not necessarily a single memory unit) is a computer readable medium (solid state memory in this example, but may be other types of memory such as a hard drive, ROM, RAM, Flash or the like) that stores computer program code. This computer program code stores instructions that are executable by the processor 208, when the program code is run on the processor 208. The internal connections between the memory 207 and the processor 208 can be understood to, in one or more example embodiments, provide an active coupling between the processor 208 and the memory 207 to allow the processor 208 to access the computer program code stored on the memory 207.

In this example the input I, output O, processor 208 and memory 207 are all electrically connected to one another internally to allow for electrical communication between the respective components I, O, 207, 208. In this example the components are all located proximate to one another so as to be formed together as an ASIC, in other words, so as to be integrated together as a single chip/circuit that can be installed into an electronic device. In other examples one or more or all of the components may be located separately from one another.

FIG. 3 depicts an apparatus 300 of a further example embodiment, such as a mobile phone. In other example embodiments, the apparatus 300 may comprise a module for a mobile phone (or PDA or audio/video player), and may just comprise a suitably configured memory 307 and processor 308.

The example embodiment of FIG. 2 comprises a display device 304 such as, for example, a liquid crystal display (LCD), e-Ink or touch-screen user interface. The apparatus 300 of FIG. 2 is configured such that it may receive, include, and/or otherwise access data. For example, this example embodiment 300 comprises a communications unit 303, such as a receiver, transmitter, and/or transceiver, in communication with an antenna 302 for connecting to a wireless network and/or a port (not shown) for accepting a physical connection to a network, such that data may be received via one or more types of networks. This example embodiment comprises a memory 307 that stores data (e.g. calibration data and/or data received from a magnetometer), possibly after being received via antenna 302 or port or after being generated at the user interface 305.

The processor 308 may receive data from the user interface 305, from the memory 307, or from the communication unit 303. It will be appreciated that, in certain example embodiments, the display device 304 may incorporate the user interface 305. Regardless of the origin of the data, these data may be outputted to a user of apparatus 300 via the display device 304, and/or any other output devices provided with apparatus. The processor 308 may also store the data for later use in the memory 307. The memory 307 may store computer program code and/or applications which may be used to instruct/enable the processor 308 to perform functions (e.g. read, write, delete, edit or process data). In this case, the processor 308 may be used to perform the determination of whether recalibration of a magnetometer is required based on received magnetometer readings.

FIG. 4 depicts a further example embodiment of an electronic device 400, such as a tablet personal computer, a portable electronic device, a portable telecommunications device, a server or a module for such a device, the device comprising the apparatus 200 of FIG. 1. The apparatus 200 can be provided as a module for device 400, or even as a processor/memory for the device 400 or a processor/memory for a module for such a device 400. The device 400 comprises a processor 408 and a storage medium 407, which are connected (e.g. electrically and/or wirelessly) by a data bus 480. This data bus 480 can provide an active coupling between the processor 408 and the storage medium 407 to allow the processor 408 to access the computer program code. It will be appreciated that the components (e.g. memory, processor) of the device/apparatus may be linked via cloud computing architecture. For example, the storage device may be a remote server accessed via the internet by the processor.

The apparatus 200 in FIG. 4 is connected (e.g. electrically and/or wirelessly) to an input/output interface 370 that receives the output from the apparatus 200 and transmits this to the device 400 via data bus 480. Interface 370 can be connected via the data bus 480 to a display 404 (touch-sensitive or otherwise) that provides information from the apparatus 200 to a user. Display 404 can be part of the device 400 or can be separate. The device 400 also comprises a processor 408 configured for general control of the apparatus 200 as well as the device 400 by providing signalling to, and receiving signalling from, other device components (e.g. from a magnetometer—not shown) to manage their operation.

The storage medium 407 is configured to store computer code configured to perform, control or enable the operation of the apparatus 200. The storage medium 407 may be configured to store settings for the other device components. The processor 408 may access the storage medium 407 to retrieve the component settings in order to manage the operation of the other device components. The storage medium 407 may be a temporary storage medium such as a volatile random access memory. The storage medium 407 may also be a permanent storage medium such as a hard disk drive, a flash memory, a remote server (such as cloud storage) or a non-volatile random access memory. The storage medium 407 could be composed of different combinations of the same or different memory types.

Figure 5A:
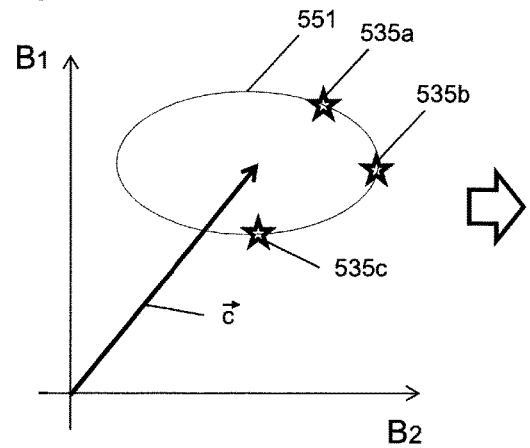
FIGS. 5a-5f illustrate an examples of received magnetometer readings and corresponding calibrated values.
Figure 5B:
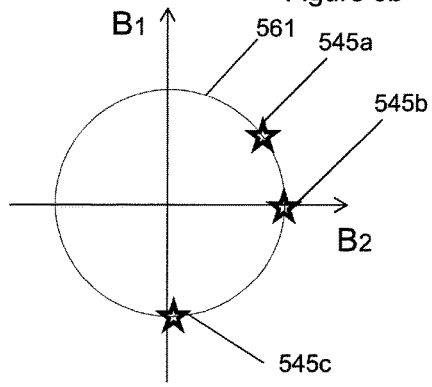

FIGS. 5a and 5b depicts the calibration of a magnetometer to compensate for hard-iron and soft-iron effects. For clarity, the components of the magnetic field vector is shown for two dimensions. It will be appreciated that the same principles may be applied for three-dimensional embodiments.

FIG. 5a depicts three magnetometer readings 535a-c received from the magnetometer for calibration, the magnetometer readings 535a-c corresponding to the magnetic field strength vectors measured for three different orientations of the magnetometer (with respect to the measured B-field). Each of the magnetometer readings 535*a-c* lie on an ellipse/ellipsoid surface 551 (ellipse for 2D case; ellipsoid for 3D case).

Using equation 2, various values for the soft-iron matrix elements of M and hard-iron vector components of $\vec{c}$ are determined such that the calibrated magnetometer values 545*a-c* corresponding to the measured magnetometer values 535*a-c* fall on a circle 561 (or a sphere in 3D case) centred on the origin. The radius of the calibrated circle (or sphere) can be determined from the values of the matrix elements of the soft-iron matrix M, and therefore the determined matrix M comprises information on the magnitude of the field strength at the time of calibration.

A recalibration is needed when either the shape of the ellipse/ellipsoid (corresponding to the soft-iron effect) or the offset (corresponding to the hard-iron effect) corresponding to the magnetometer measurements have changed. The offset $\vec{c}$ is indicated by the arrow connecting the origin and the centre of the ellipse/ellipsoid in FIG. 5*a*. Recalibration of the magnetometer comprises at least one of: adjusting the values of the pre-calibrated vector describing the hard-iron effect (which compensates for the offset changes); and adjusting the relative values of the matrix describing the soft-iron effect (which compensates for the changes in the shape of the measured ellipsoid).

In other words if the corresponding calibrated magnetometer values corresponding to the received plurality of magnetometer readings (calibrated using the pre-calibrated matrix and pre-calibrated vector) falls on a circle/sphere (regardless of whether the radius is the same or different to previously calibrated magnetometer values), then recalibration may not be required.

Figure 5C:
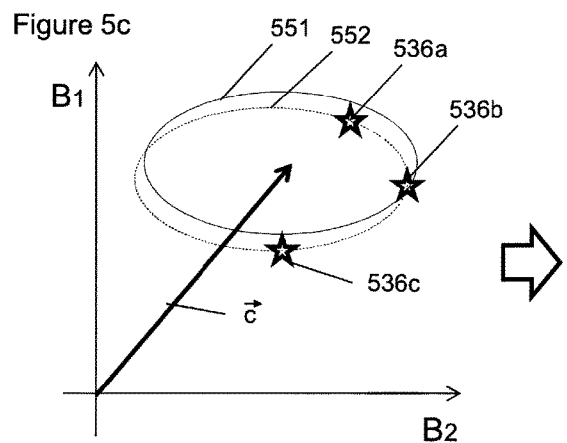
Figure 5D:
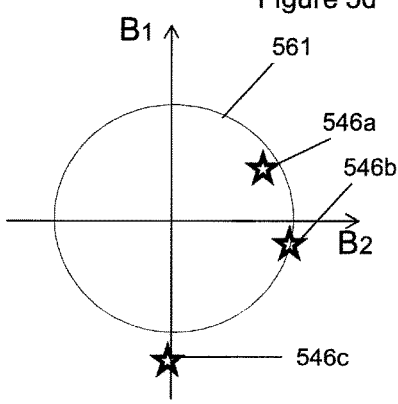

For example, the offset may be changed if some part of the device housing the magnetometer (e.g. phone) gets magnetized. Change in the offset is seen as a change of the vector lengths in the calibrated space, as shown in FIG. 5*c*. This causes the newly received measurements 536*a-c* of magnetic field strength vectors not to correspond to the circle/sphere surface 561 when the old calibration values are used. That is, because the newly measured magnetometer values fall on a different ellipse/ellipsoid 552, the corresponding magnetic field strength values 546*a-c* calculated using the old calibration do not fall on circle/sphere 561. This is shown in FIG. 5*d*.

Figure 5E:
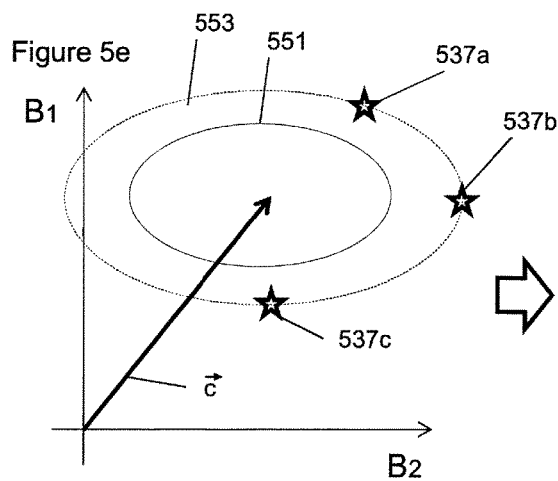
Figure 5F:
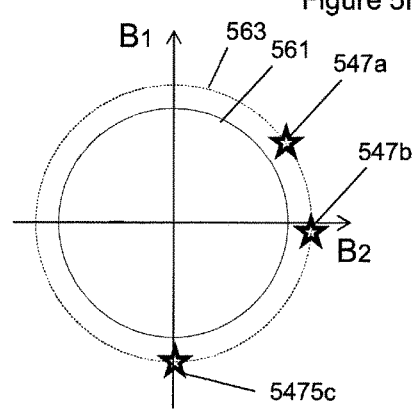

When the magnetic field outside the magnetometer and housing is changed (as in FIG. 5*e*) the calibrated magnetic field strength values also deviate from the previously determined calibrated sphere (as shown in FIG. 5*f*). However, changes in the field strength outside the phone are not as a result of hard-iron or soft-iron effects as hard-iron or soft-iron effects are a result of changes in the magnetometer and any housing with an orientation which is fixed with respect to the magnetometer (i.e. any housing which rotates with the magnetometer).

Deviations caused by the magnetic field itself (e.g. the measured magnetic field strength changing as the magnetometer is moved) results in the measured magnetometer values falling on an ellipse/ellipsoid with the same shape and position (as defined by the offset) as that of the calibrated value but with a different size. Therefore, when the corresponding values are determined using the M and $\vec{c}$ which were determined during the calibration depicted in FIGS. 5*a* and 5*b*, the corresponding values fall on a circle/sphere 563 centred on the origin. However the radius of the circle/sphere 563 is different from the circle/sphere 561 corresponding to the magnetometer readings used for the original calibration. This is shown in FIG. 5*f*.

It will be appreciated from FIGS. 5*a*-5*f* that to determine whether the field strength has changed or whether hard or soft-iron effects are causing the discrepancy require a plurality of magnetometer readings of magnetic field strength vectors to be taken around the ellipsoid (i.e. for a range of different orientations). Because of this, both situations may previously have been considered as "loss of calibration", even though the same matrix M and offset $\vec{c}$ could be used in the situation shown in FIGS. 5*e*-5*f* to correctly determine the direction of the magnetic field outside the device (i.e. the direction of the vector in the calibrated space). As noted above, in mathematical terms, matrix M has nine parameters, defining both the shape and the size of the ellipsoid. However, the size may be irrelevant in many compass applications, as only the shape is needed to correctly determine the compass heading equal to the magnetic field direction outside the device. Therefore a scaled version of soft-iron effect matrix, $\hat{M}$ can be used by the apparatus. That is, $$M = s\hat{M}$$

where s is a scale factor. That is, taken alone, $\hat{M}$ does not provide information on the size (e.g. which may be mathematically related to the determinant of the matrix) of the originally calibrated soft-iron effect matrix, M (and therefore on the radius of the sphere in the calibrated space giving the magnitude of the field strength). However, this may still allow the actual compass heading to be defined according to the magnetic vector direction only, without using the vector length, as the scaling of matrix $\hat{M}$ (or M) can be chosen freely. According to the present disclosure, determining whether the magnetometer is calibrated or not (and whether recalibration is necessary) is done by determining how well the measurements can be explained by using the current shape of the ellipsoid described by a scaled version of the stored matrix ($\hat{M}$ or M), and the current offset value $\vec{c}$.

Figure 6:
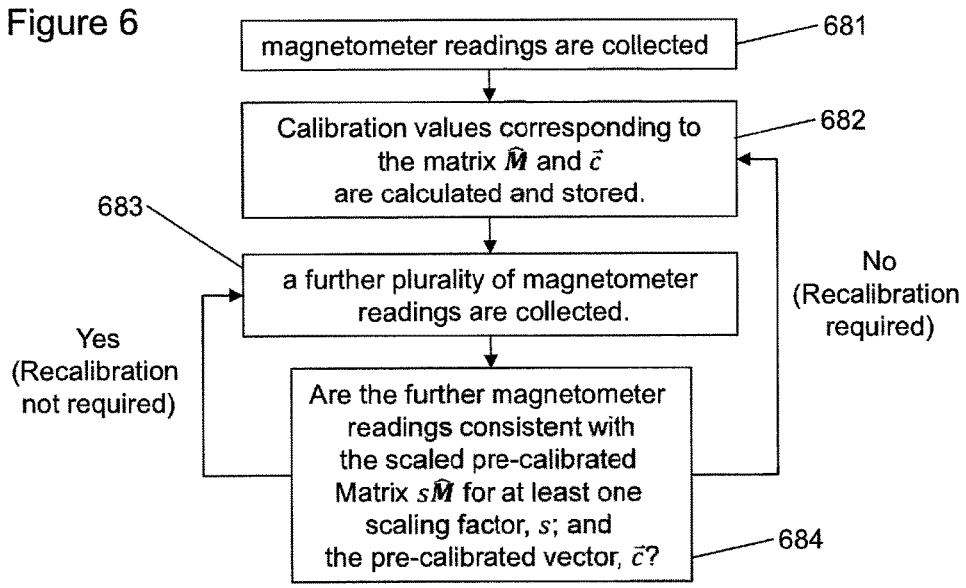
FIG. 6 illustrates a flowchart according to a method of the present disclosure.

FIG. 6 gives a flow diagram of a method which may be used on received magnetometer data.

To calibrate the magnetometer (which may be, for example, an anisotropic magneto-resistive (AMR) sensor), a plurality of magnetometer readings are collected 681. In this case, magnetometer readings are collected until a predefined coverage around the ellipsoid is achieved. That is, the apparatus may be configured to perform the determination in response to one or more of the following conditions being satisfied: the number of received magnetometer readings exceeds a readings number threshold (e.g. greater than 10 or greater than 100); the range of orientations corresponding to the received magnetometer readings exceeds an orientation range threshold; and the number of different orientations corresponding to the received magnetometer readings exceeds an orientation number threshold. Regarding the angular coverage, it will be appreciated that the measured 2D ellipse or 3D ellipsoid should have a particular symmetry which may be taken into account when determining when sufficient readings have been taken. For example, a 3D ellipsoid will have three reflection symmetry axes and so these may be taken into account when determining whether the angular coverage criterion is satisfied (e.g. measuring the magnetic field strength along one direction and then along a diametrically opposite direction may provide information on the offset but may not provide additional information on the shape of the ellipsoid which gives the relative sizes of the soft-iron matrix elements).

Then an ellipsoid is fitted 682 to the collected magnetometer readings when a predefined data coverage and amount is reached. In this case, values corresponding to the scaled (or normalised) matrix $\hat{M}$ is stored. That is, the information related to the field strength/ellipsoid size is not stored.

When determining the correctness of the calibration, a further plurality of magnetometer readings are collected 683. The apparatus is configured to determine 684 whether these further magnetometer readings are consistent (e.g. within a predetermined consistency threshold) with:

a scaled pre-calibrated matrix $\hat{M}$ describing the soft-iron effect for at least one scaling factor, s, of the pre-calibrated matrix; and a pre-calibrated vector, $\vec{c}$, describing the hard-iron effect.

If the further magnetometer readings are consistent with the calibrated values, the current calibration is retained and used; and if not, a recalibration is performed. Recalibration of the magnetometer comprises at least one of: adjusting the values of the pre-calibrated vector describing the hard-iron effect; and adjusting the relative values of the matrix describing the soft-iron effect.

In this implementation, information on the radius of the calibrated circle/sphere (which corresponds to strength of the magnetic field) is not stored. This may reduce memory requirements. In addition, because there is no presumption of a particular value for the magnetic field strength, this implementation may be quicker in situations where the magnetic field strength changes often (e.g. when moving around in a building or built up area where the magnetic field may be shielded differently depending on the position).

Figure 7:
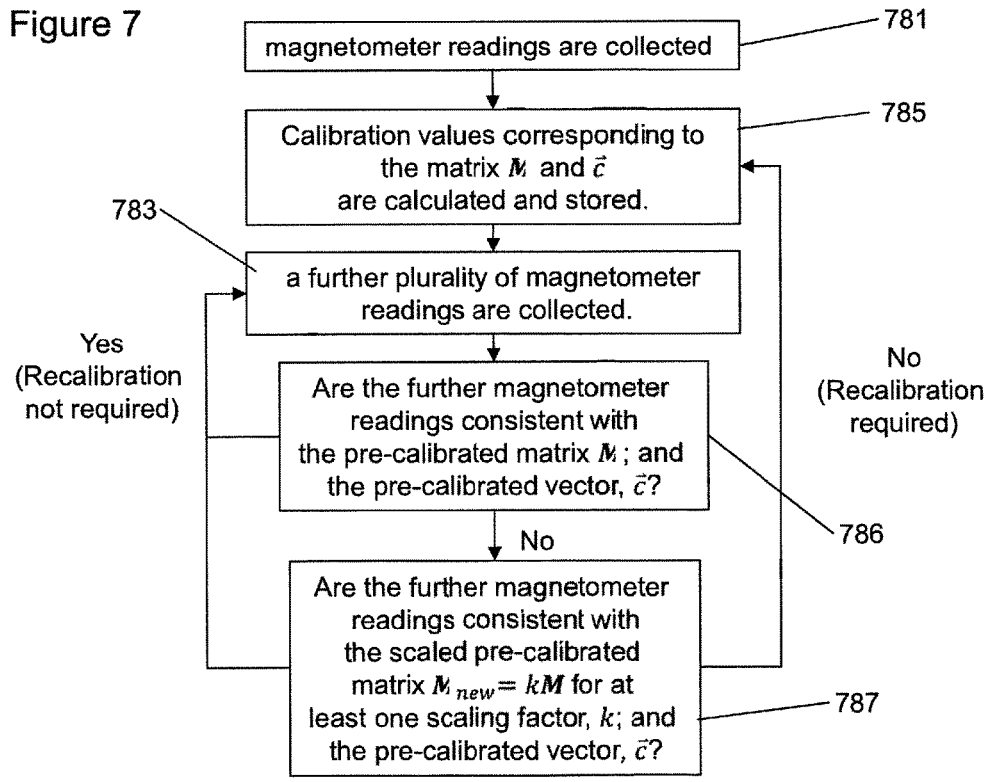
FIG. 7 illustrates a further flowchart according to a method of the present disclosure.

FIG. 7 gives a flow diagram of a further method which may be used on received magnetometer data.

To calibrate the magnetometer, a plurality of magnetometer readings are collected 781. In this case, magnetometer readings are collected until a predefined coverage around the ellipsoid is achieved.

Then an ellipse/ellipsoid is fitted 785 to the collected magnetometer readings when a predefined data coverage and amount is reached such that the corresponding calibrated values fall on a circle/sphere centred on the origin. That is, a calibration is performed to determine values for the matrix elements of M and vector elements $\vec{c}$, in equations 1 and 2. Unlike the previous method, the matrix M which defines the shape of the ellipse/ellipsoid also comprises information related to the ellipse/ellipsoid size (which in turn is related to the field strength measured during the calibration).

When determining the correctness of the original calibration, a plurality of new magnetometer readings are received 783. As a first test, these plurality of new magnetometer readings are tested 786 to determine how close that data gets to the surface of the sphere described by matrix M and offset vector $\vec{c}$. That is, the equation $\vec{B} = M^{-1}(\vec{B'} - \vec{c})$ is used.

That is, unlike the previous implementation, because the field strength at the time of calibration is stored, it is easy to determine if an individual sample is on the surface of the calibrated circle/sphere or not. This implementation may be quicker in situations where the magnetic field strength is not expected to change because there is no free variable (the scaling factor) to determine in the first stage 786 of determining the correctness of the original calibration. Such situations where magnetic field strength can be assumed to be constant, might include walking in a forest or a boat in the ocean (e.g. situations where external objects do not shield or otherwise affect the magnetic field differently as you move around them).

If the values corresponding to the further magnetometer readings calculated using the original calibration matrix M and offset vector $\vec{c}$ do not fall on the sphere surface (e.g. or within a predetermined range, or consistency threshold, of the sphere surface on which the original calibrated magnetometer readings lay), corresponding magnetometer values are calculated 787 using a new scaled version of the matrix $M_{new} = kM$, without changing the shape of the ellipsoid or the offset, $\vec{c}$.

If the corresponding magnetometer values are found to fall on a sphere centred on the origin using the rescaled version of $M_{new}$ and the unchanged offset $\vec{c}$, the calibration matrix M is replaced with the new scaling matrix $M_{new}$ (this is equivalent to scaling the old matrix by the scale factor, k); otherwise a recalibration is performed.

It will be appreciated that other embodiments, in order to improve the performance in demanding environments and in order to enable continuous improvement of the calibration, the apparatus may be configured to store multiple pairs of matrix M and vector, $\vec{c}$, and compare each new measurement previously stored calibration values. This assures also that if a misjudgement occurs because of some magnetic anomaly and recalibration is done in vain creating incorrect calibration values, the previous calibration is restored immediately when the anomaly disappears.

By storing also those calibrations that are created without having proper data coverage (insufficient data calibration "IDC"), we can update the data coverage information every time we get new data buffers matching to the IDC, thus enabling the possibility of continuous calibration even with very infrequent phone movements, and making it possible to unite samples collected with the same total magnetic field strength, even though the field strength would have had some different value between the time those samples were collected.

Advantages of the above described embodiments may include that the apparatus automatically accounts for changes in field strength (e.g. which may occur, for example, every time the user walks through a door with enough iron or steel in the doorframe). The embodiments may also be better able to utilize data that is a combination of parts collected under different field strengths. In addition, embodiments may be able to rapidly recover from a miscalibration created by a magnetic anomaly (e.g. if the field strength changes during calibration).

It will be appreciated that in each of the above implementations, the apparatus is configured to determine whether or not recalibration is required of a magnetometer configured to compensate for hard-iron and soft-iron effects by determining whether a plurality of magnetometer readings received from the magnetometer is consistent with: a scaled pre-calibrated matrix describing the soft-iron effect for at least one scaling factor of the pre-calibrated matrix; and a pre-calibrated vector describing the hard-iron effect.

Figure 8A:
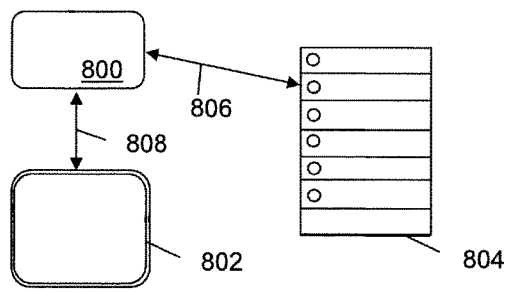
FIGS. 8a and 8b show example apparatus interacting with a remote server and with a remote cloud.
Figure 8B:
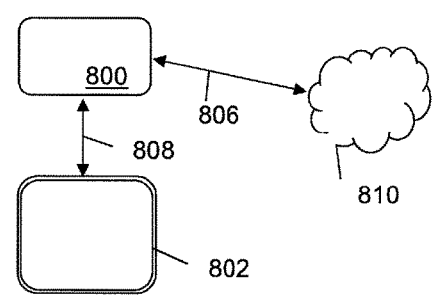

FIG. 8a shows an example of an apparatus 800 in communication with a remote server. FIG. 8b shows an example of an apparatus 800 in communication with a "cloud" for cloud computing. In FIGS. 8a and 8b, apparatus 800 (which may be apparatus 200, 300 or 400) is also in communication with a further apparatus 802. The apparatus 802 may be a phone or a car, for example. In other examples, the apparatus 800 and further apparatus 802 may both be comprised within a device such as a portable communications device or PDA. Communication may be via a communications unit, for example.

FIG. 8a shows the remote computing element to be a remote server 804, with which the apparatus 800 may be in wired or wireless communication (e.g. via the internet, Bluetooth, NFC, a USB connection, or any other suitable connection as known to one skilled in the art). In FIG. 8b, the apparatus 800 is in communication with a remote cloud 810 (which may, for example, be the Internet, or a system of remote computers configured for cloud computing). For example, the apparatus determining whether the magnetometer readings are consistent with the scaled soft-iron matrix for at least one scaling factor; and the pre-calibrated hard-iron vector may be located at a remote server 804 or cloud 810 and accessible by the first apparatus 800. In other examples the further apparatus 802 may also be in direct communication with the remote server 804 or cloud 810.

Figure 9:
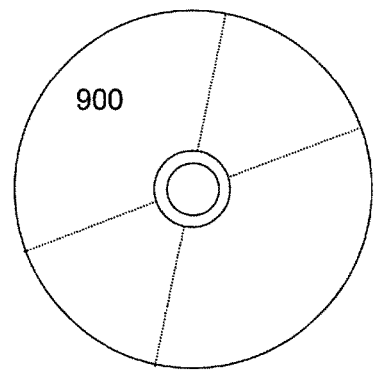
FIG. 9 illustrates schematically a computer readable medium providing a program.

FIG. 9 illustrates schematically a computer/processor readable medium 900 providing a program according to an example. In this example, the computer/processor readable medium is a disc such as a digital versatile disc (DVD) or a compact disc (CD). In other examples, the computer readable medium may be any medium that has been programmed in such a way as to carry out an inventive function. The computer program code may be distributed between the multiple memories of the same type, or multiple memories of a different type, such as ROM, RAM, flash, hard disk, solid state, etc.

The apparatus shown in the above examples may be a portable electronic device, a laptop computer, a mobile phone, a Smartphone, a tablet computer, a personal digital assistant, a digital camera, a smartwatch, smart eyewear, a pen based computer, a non-portable electronic device, a desktop computer, a monitor, a household appliance, a smart TV, a server, or a module/circuitry for one or more of the same.

Any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

Any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

Any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

The term "signalling" may refer to one or more signals transmitted as a series of transmitted and/or received electrical/optical signals. The series of signals may comprise one, two, three, four or even more individual signal components or distinct signals to make up said signalling. Some or all of these individual signals may be transmitted/received by wireless or wired communication simultaneously, in sequence, and/or such that they temporally overlap one another.

With reference to any discussion of any mentioned computer and/or processor and memory (e.g. including ROM, CD-ROM etc.), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to examples thereof, it will be understood that various omissions and substitutions and changes in the form and details of the devices and methods described may be made by those skilled in the art without departing from the scope of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or examples may be incorporated in any other disclosed or described or suggested form or example as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising:
   a processor; and
   a memory including computer program code,
   the memory and the computer program code configured to, with the processor, cause the apparatus to perform at least the following:
   determine whether or not recalibration is required of a magnetometer configured to compensate for hard-iron and soft-iron effects by determining whether a plurality of magnetometer readings received from the magnetometer is consistent with:
      a scaled pre-calibrated matrix describing the soft-iron effect for at least one scaling factor of the pre-calibrated matrix; or
      a pre-calibrated vector describing the hard-iron effect; and
   recalibrate the magnetometer based on the result from determining whether or not recalibration is required.

2. The apparatus of claim 1, wherein recalibration of the magnetometer comprises at least one of:
   adjusting the values of the pre-calibrated vector describing the hard-iron effect; and
   adjusting the relative values of the matrix describing the soft-iron effect.

3. The apparatus of claim 1, wherein the plurality of magnetometer readings correspond to different orientations of the magnetometer taken at substantially the same position.

4. The apparatus of claim 1, wherein the pre-calibrated matrix is independent of the magnetic field strength corresponding to the calibration.

5. The apparatus of claim 1, wherein the pre-calibrated matrix comprises information relating to the magnetic field strength corresponding to the calibration.

6. The apparatus of claim 1, wherein the apparatus is configured to calibrate the magnetometer.

7. The apparatus of claim 1, wherein the apparatus is configured to perform the determination in response to one or more of the following conditions being satisfied:
   the number of received magnetometer readings exceeds a readings number threshold;
   the range of orientations corresponding to the received magnetometer readings exceeds an orientation range threshold; and
   the number of different orientations corresponding to the received magnetometer readings exceeds an orientation number threshold.

8. The apparatus of claim 1, wherein the plurality of magnetometer readings comprise over 10 magnetometer readings.

9. The apparatus of claim 1, wherein the plurality of magnetometer readings comprise more than 100 magnetometer readings.

10. The apparatus of claim 1, wherein the apparatus is configured to determine that recalibration is not required if the received magnetometer readings are consistent, within a consistency threshold, with the scaled pre-calibrated matrix describing the soft-iron effect for at least one scaling factor of the pre-calibrated matrix; and the pre-calibrated vector describing the hard-iron effect.

11. The apparatus of claim 1, wherein the apparatus is configured to store multiple sets of pre-calibration data, each set of pre-calibration data comprising a scaled pre-calibrated matrix describing the soft-iron effect; and a pre-calibrated vector describing the hard-iron effect.

12. The apparatus of claim 1, wherein the apparatus is configured to determine whether or not recalibration is required of a magnetometer by determining whether a plurality of magnetometer readings received from the magnetometer is consistent with at least one of multiple sets of pre-calibration data, each set of pre-calibration data comprising a scaled pre-calibrated matrix describing the soft-iron effect; and a pre-calibrated vector describing the hard-iron effect comprising a scaled pre-calibrated matrix describing the soft-iron effect; and a pre-calibrated vector describing the hard-iron effect.

13. The apparatus of claim 1, wherein the apparatus is configured to recalibrate the magnetometer based on the plurality of received magnetometer readings if the plurality of received magnetometer readings is not consistent with:
   a scaled pre-calibrated matrix describing the soft-iron effect for at least one scaling factor of the pre-calibrated matrix; and
   a pre-calibrated vector describing the hard-iron effect.

14. A method, the method comprising:
   determining whether or not recalibration is required of a magnetometer configured to compensate for hard-iron and soft-iron effects by determining whether a plurality of magnetometer readings received from the magnetometer is consistent with:
   a scaled pre-calibrated matrix describing the soft-iron effect for at least one scaling factor of the pre-calibrated matrix; and
   a pre-calibrated vector describing the hard-iron effect.

15. A computer program, the computer program configured to:
   enable determination of whether or not recalibration is required of a magnetometer configured to compensate for hard-iron and soft-iron effects by determining whether a plurality of magnetometer readings received from the magnetometer is consistent with:
   a scaled pre-calibrated matrix describing the soft-iron effect for at least one scaling factor of the pre-calibrated matrix; and
   a pre-calibrated vector describing the hard-iron effect.

* * * * *